(12) United States Patent
Itou

(10) Patent No.: US 8,630,733 B2
(45) Date of Patent: Jan. 14, 2014

(54) SUBSTRATE PROCESSING APPARATUS AND SUBSTRATE TRANSFER METHOD

(75) Inventor: Kouichi Itou, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 527 days.

(21) Appl. No.: 12/892,109

(22) Filed: Sep. 28, 2010

(65) Prior Publication Data

US 2011/0076120 A1     Mar. 31, 2011

(30) Foreign Application Priority Data

Sep. 30, 2009   (JP) ................................ 2009-226458
Aug. 23, 2010   (JP) ................................ 2010-186263

(51) Int. Cl.
*H01L 21/677*   (2006.01)

(52) U.S. Cl.
USPC ........... 700/218; 700/228; 700/114; 700/101; 700/95; 414/225.01

(58) Field of Classification Search
USPC ........................................................ 700/228
See application file for complete search history.

(56) References Cited

U.S. PATENT DOCUMENTS

| | | | |
|---|---|---|---|
| 7,286,890 B2 * | 10/2007 | Machiyama et al. | 700/114 |
| 8,303,232 B2 | 11/2012 | Ishida | |
| 2002/0103556 A1 * | 8/2002 | Yasuda | 700/95 |
| 2006/0291988 A1 * | 12/2006 | Machiyama et al. | 414/792.7 |
| 2008/0133041 A1 * | 6/2008 | Schmidt | 700/101 |
| 2008/0299684 A1 * | 12/2008 | Rothe et al. | 438/14 |
| 2009/0088895 A1 * | 4/2009 | Schmidt et al. | 700/228 |
| 2009/0101180 A1 * | 4/2009 | Jang et al. | 134/61 |

FOREIGN PATENT DOCUMENTS

| | | | | |
|---|---|---|---|---|
| JP | 2002-110609 A | 4/2002 | | |
| JP | 2002110609 | * 12/2002 | ............ | H01L 21/304 |

* cited by examiner

*Primary Examiner* — Gene Crawford
*Assistant Examiner* — Kyle Logan
(74) *Attorney, Agent, or Firm* — Pearne & Gordon LLP

(57) ABSTRACT

A substrate processing apparatus includes a loading/unloading unit including a mounting table on which a storage container accommodating a target substrate is mounted; a processing unit set including a plurality of processing units that perform a process on the target substrate; a plurality of transit units that transit the target substrate between the loading/unloading unit and the processing unit set; a selection unit that receives input for selecting a storage container for loading, a storage container for unloading, and a processing unit to be used for processing the target substrate; and a transfer recipe creating unit that automatically selects a transit unit to be used among the plurality of transit units based on the storage container for loading, the storage container for unloading, and the processing unit selected through the selection unit, automatically generates a transfer route of the target substrate, and creates a transfer recipe.

17 Claims, 12 Drawing Sheets

FIG. 9

| NO. | STEP NO. | |
|---|---|---|
| 1 | 1 | 1-* FUST |
| 2 | 2 | 2-11 TRS |
|   | 3 | 2-12 TRS |
|   | 4 | 2-13 TRS |
|   | 5 | 2-14 TRS |
|   | 6 | 2-21 TRS |
|   | 7 | 2-22 TRS |
| 3 | 8 | 3-5 RVS |
|   | 9 | 4-5 RVS |
| 4 | 10 | 3-1 SCR |
|   | 11 | 3-2 SCR |
|   | 12 | 4-1 SCR |
|   | 13 | 4-2 SCR |
| 5 | 14 | 3-6 RVS |
|   | 15 | 4-6 RVS |
| 6 | 16 | 3-3 SCR |
|   | 17 | 3-4 SCR |
|   | 18 | 4-3 SCR |
|   | 19 | 4-4 SCR |
| 7 | 20 | 2-15 TRS |
|   | 21 | 2-16 TRS |
|   | 22 | 2-23 TRS |
|   | 23 | 2-24 TRS |
| 8 | 24 | 1-* FUST |

*FIG. 10*

| TRANSFER ARM BLOCK NO. | TRANSFER ARM ACCESS MODULE BLOCK NO. | ACCESS PERMIT FLAG (AccsPermit) |
|---|---|---|
| 1-0 | 1-1 | |
| | 1-2 | |
| | 1-3 | |
| | 1-4 | |
| | 2-11 | |
| | 2-12 | |
| | 2-13 | |
| | 2-14 | |
| | 2-15 | |
| | 2-16 | |
| 2-0 | 2-11 | |
| | 2-12 | |
| | 2-13 | |
| | 2-14 | |
| | 2-15 | ACCS_PERMIT_IN |
| | 2-16 | ACCS_PERMIT_IN |
| | 2-21 | |
| | 2-22 | |
| | 2-23 | |
| | 2-24 | |
| 3-0 | 2-11 | |
| | 2-12 | |
| | 2-13 | |
| | 2-14 | |
| | 2-15 | ACCS_PERMIT_IN |
| | 2-16 | ACCS_PERMIT_IN |
| | 3-1 | |
| | 3-2 | |
| | 3-3 | |
| | 3-4 | |
| | 3-5 | |
| | 3-6 | |
| 4-0 | 2-21 | |
| | 2-22 | |
| | 2-23 | ACCS_PERMIT_IN |
| | 2-24 | ACCS_PERMIT_IN |
| | 4-1 | |
| | 4-2 | |
| | 4-3 | |
| | 4-4 | |
| | 4-5 | |
| | 4-6 | |

FIG. 12

| | MODULE | | RECIPE NAME |
|---|---|---|---|
| 1 | 1-* | START STAGE | |
| 2 | 2-11 | TRS | |
| | 2-12 | TRS | |
| | 2-13 | TRS | |
| | 2-14 | TRS | |
| | 2-21 | TRS | |
| | 2-22 | TRS | |
| 3 | 3-5 | RVS | |
| | 4-5 | RVS | |
| 4 | 3-1 | SCR | 111 |
| | 3-2 | SCR | 111 |
| | 4-1 | SCR | 111 |
| | 4-2 | SCR | 111 |
| 5 | 3-6 | RVS | |
| | 4-6 | RVS | |
| 6 | 3-3 | SCR | 111 |
| | 3-4 | SCR | 111 |
| | 4-3 | SCR | 111 |
| | 4-4 | SCR | 111 |
| 7 | 2-15 | TRS | |
| | 2-16 | TRS | |
| | 2-23 | TRS | |
| | 2-24 | TRS | |
| 8 | 1-* | END STAGE | |
| 9 | | | |

WaferFlow/PRD/111

END | STOP | SAVE | PROPERTY | STEP MANIPULATION

SUBSTRATE PROCESSING APPARATUS AND SUBSTRATE TRANSFER METHOD

CROSS-REFERENCE TO RELATED APPLICATION

This application claims the benefit of Japanese Patent Application No. 2009-226458 filed on Sep. 30, 2009 and Japanese Patent Application No. 2010-186263 filed on Aug. 23, 2010, the entire disclosures of which are incorporated herein by reference.

FIELD OF THE INVENTION

The present disclosure relates to a substrate processing apparatus which transfers a substrate to one of a plurality of processing units from a storage container accommodating the substrate and performs a process onto the substrate, and a substrate transfer method of the substrate processing apparatus.

BACKGROUND OF THE INVENTION

In a manufacturing process of a semiconductor device or in a manufacturing process of a flat panel display (FPD), there has been performed a cleaning process for removing particles or contaminations or a resist coating and developing process to a target substrate such as a semiconductor wafer or a glass substrate.

In a substrate processing apparatus for performing the above-described processes, a plurality of processing units for performing a process may be provided, a plurality of target substrates accommodated in a storage container may be transferred to each of the processing units in sequence by a transfer mechanism and processed therein, and the target substrates processed in each processing unit may be accommodated in the storage container.

In such a substrate processing apparatus, a process needs be performed at high speed. Therefore, there has been used a substrate processing apparatus including: a loading/unloading unit on which a storage container for accommodating substrates is mounted; a processing unit set including a plurality of processing units for performing a process; a plurality of stacked transit units for transiting target substrates between the loading/unloading unit and the processing unit set; and a transfer mechanism for transferring the target substrates. With this configuration, the target substrates unloaded in sequence from the storage container are transferred to one of the transit units by the transfer mechanism and transferred from the transit unit to each of the processing units by the transfer mechanism and then the processed target substrates are received by the storage container from the processing units via one of the transit units (see, for example, Patent Document 1).

Patent Document 1: Japanese Patent Laid-open Publication No. 2002-110609

In the substrate processing apparatus including a plurality of processing units and a plurality of transit units as described above, a target substrate is transferred from a storage container to one of the plurality of processing units via one of the plurality of transit units and processed therein. Here, if multiple processes are performed, the target substrate may be transferred to another processing unit and another process may be performed thereon. Thereafter, the processed target substrate needs to be transferred to the storage container via one of the transit units. Here, the storage container, the processing units, and the transit units to be used may be variously selected depending on a process pattern, and, thus, a transfer recipe which defines a transfer route of the target substrate may be created by an operator by selecting all modules to be used, i.e., the storage container, the transit units, and the processing units.

However, recently, in such a substrate processing apparatus, a requirement for throughput of a process is getting stricter, and in order to cope with this situation, the number of processing units or transit units has increased, and, thus, it becomes complicated to select all modules to be used whenever a transfer recipe is created. Further, since there may be a limitation in selecting the transit units depending on the selected modules, it is required to verify whether or not selection is proper at the time of creation of recipes and if not proper, it is required to recreate recipes with effort. Meanwhile, even if selection is proper and a transfer is available, it is difficult to know whether or not an optimum transit unit has been selected in view of throughput.

The present disclosure has been conceived in view of the foregoing circumstances and provides a substrate processing apparatus capable of simplifying creation of a transfer recipe and transferring a target substrate along an optimum transfer route and a substrate transfer method of the substrate processing apparatus.

BRIEF SUMMARY OF THE INVENTION

In accordance with one aspect of the present disclosure, there is provided a substrate processing apparatus including a loading/unloading unit including a mounting table on which a storage container accommodating a target substrate is mounted; a processing unit set including a plurality of processing units that perform a process on the target substrate; a plurality of transit units that transit the target substrate between the loading/unloading unit and the processing unit set; a selection unit that receives an input for selecting a storage container for loading, an input for selecting a storage container for unloading, and an input for selecting a processing unit to be used for processing the target substrate; and a transfer recipe creating unit that automatically selects a transit unit to be used among the plurality of transit units based on the storage container for loading, the storage container for unloading, and the processing unit selected through the selection unit, automatically generates a transfer route of the target substrate, and creates a transfer recipe.

In accordance with another aspect of the present disclosure, there is provided a substrate transfer method of a substrate processing apparatus that unloads a target substrate from a storage container accommodating the target substrate, transfers the target substrate into one of a plurality of processing units performing a process on the target substrate via one of a plurality of transit units transiting the target substrate, and performs a process on the target substrate. The substrate transfer method includes selecting a storage container and a processing unit to be used; creating a transfer recipe by automatically selecting a transit unit to be used based on the selected storage container and the selected processing unit and automatically generating a transfer route of the target substrate; and controlling a transfer of the target substrate based on the created transfer recipe.

In accordance with the present disclosure, if a storage container for loading, a storage container for unloading, and processing units to be used are selected, transit units to be used can be automatically selected depending on the selected storage container for loading, the selected storage container for unloading and the selected processing units. Further, a transfer route of the target substrate can be automatically calculated, and a transfer recipe can be created. Therefore, creation of a transfer recipe can be simplified and a wafer W can be transferred along a transfer route through which an optimum throughput can be obtained.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which:

FIG. 9 shows an example of a transfer recipe created by a transfer recipe creating unit;

FIG. 10 shows a transfer arm access table;

FIG. 12 shows a screen in which detailed transit units of the transfer recipe display screen of FIG. 11 are displayed.

DETAILED DESCRIPTION OF THE INVENTION

Hereinafter, embodiments of the present disclosure will be explained in detail with reference to accompanying drawings. In the present embodiment, there will be explained a substrate processing apparatus configured as a cleaning apparatus in which a scrub cleaning process is performed onto a front surface and a rear surface of a semiconductor wafer (hereinafter, simply referred to as "wafer") serving as a target substrate. Here, the front surface of the wafer is a device forming surface and the rear surface is the opposite surface thereof.

Figure 1:
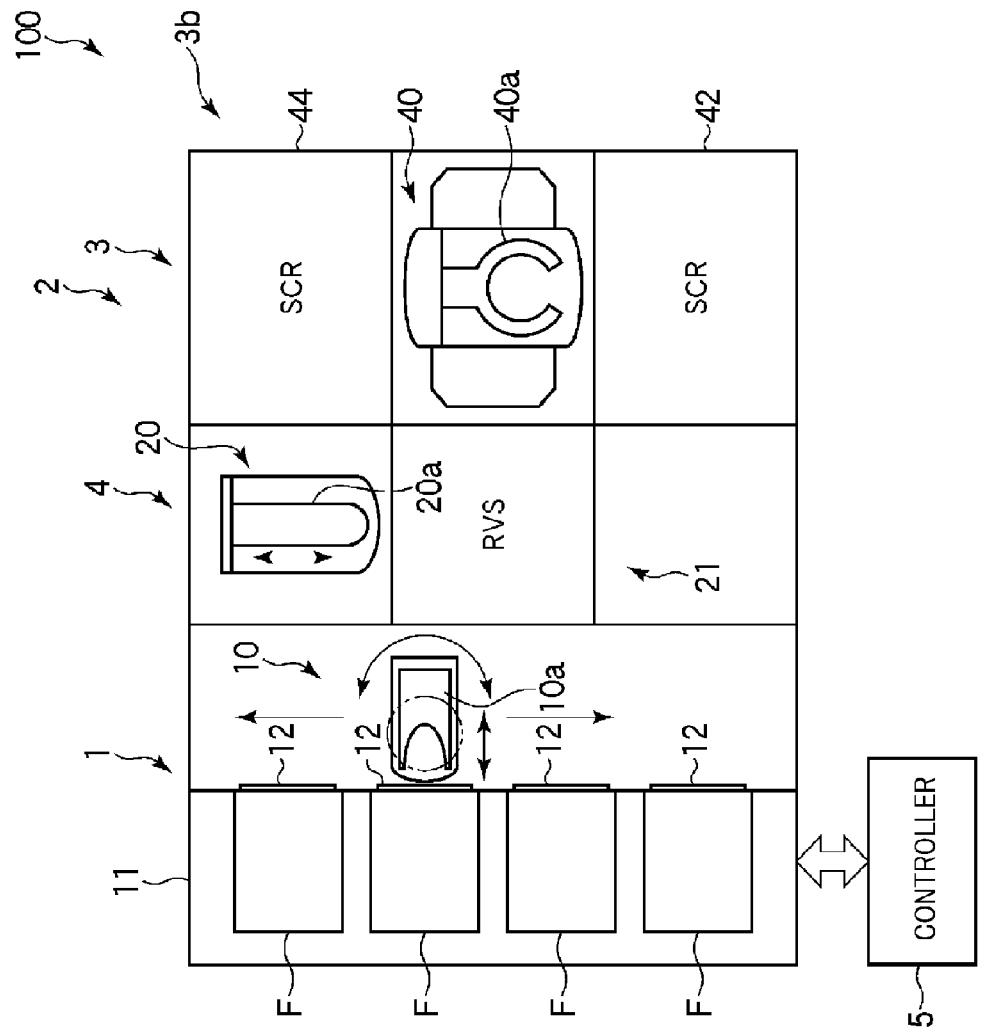
FIG. 1 is a plane view of a schematic configuration of a substrate processing apparatus in accordance with an embodiment of the present disclosure.
Figure 2:
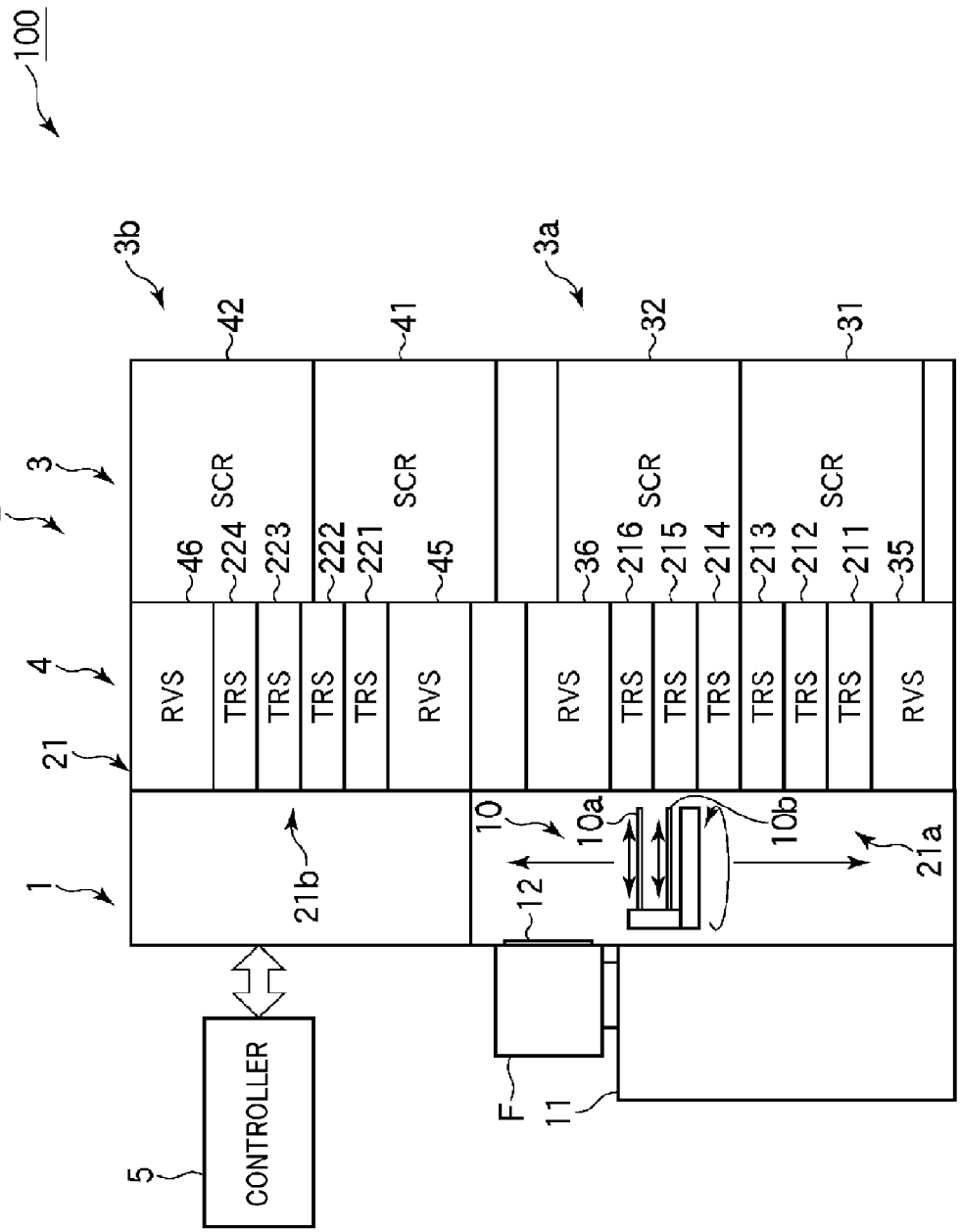
FIG. 2 is a longitudinal cross sectional side view of a schematic configuration of the substrate processing apparatus in accordance with the embodiment of the present disclosure.
Figure 3:
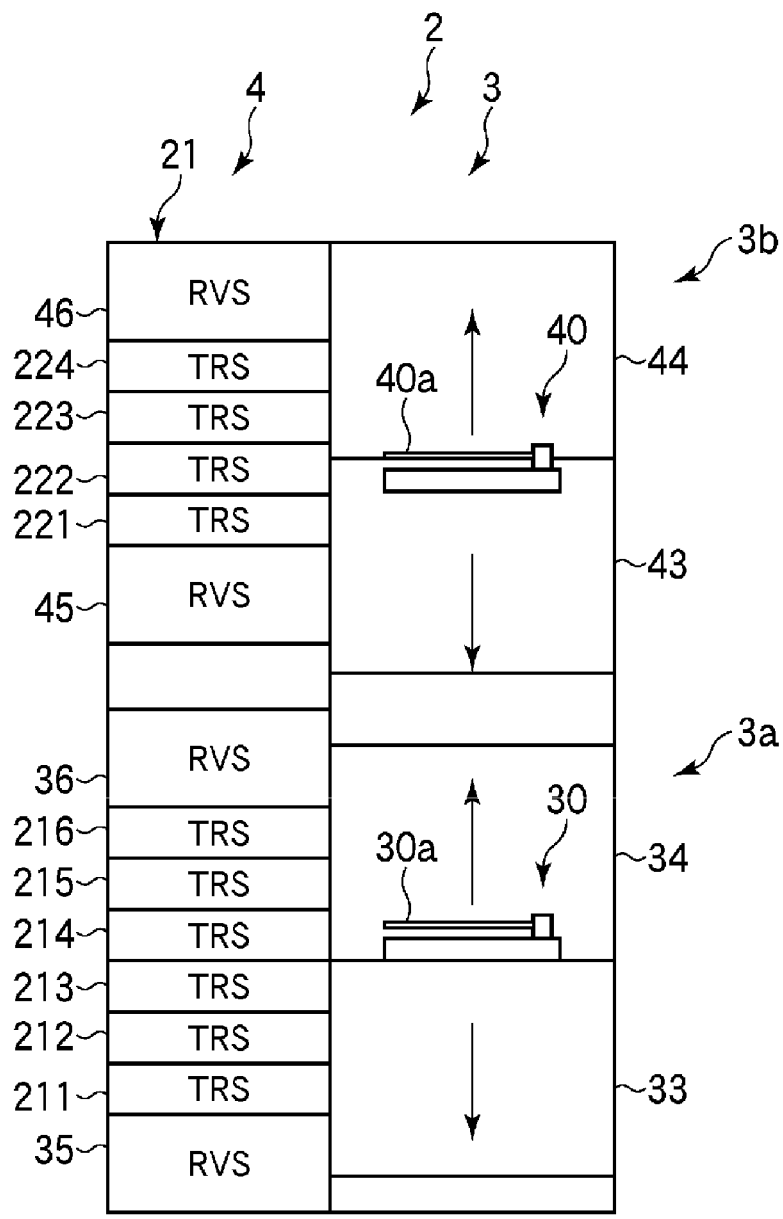
FIG. 3 shows the inside of a processing block of the substrate processing apparatus of FIG. 1.
Figure 4:
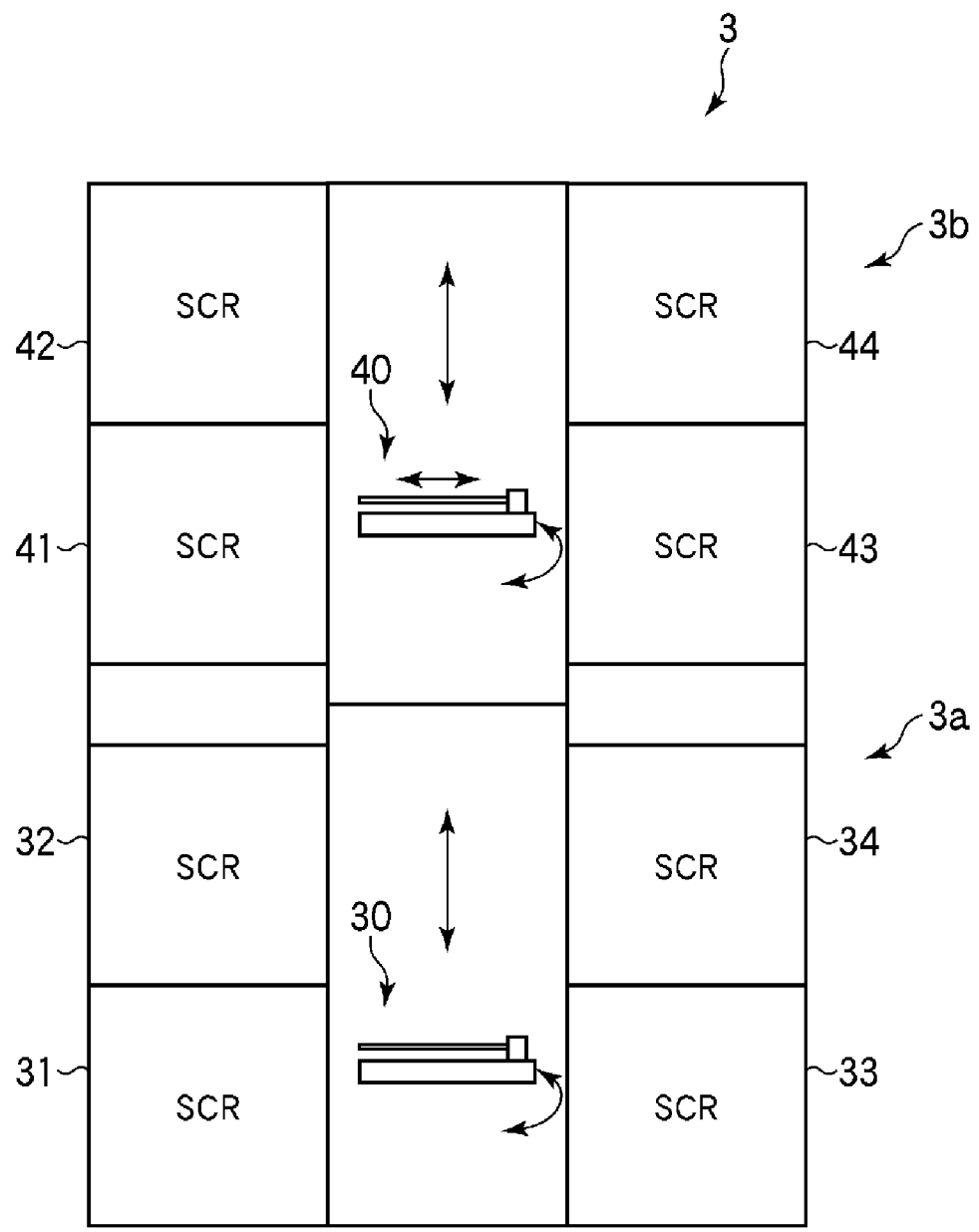
FIG. 4 shows the processing block when viewed from the opposite side of a loading/unloading block.
Figure 5:
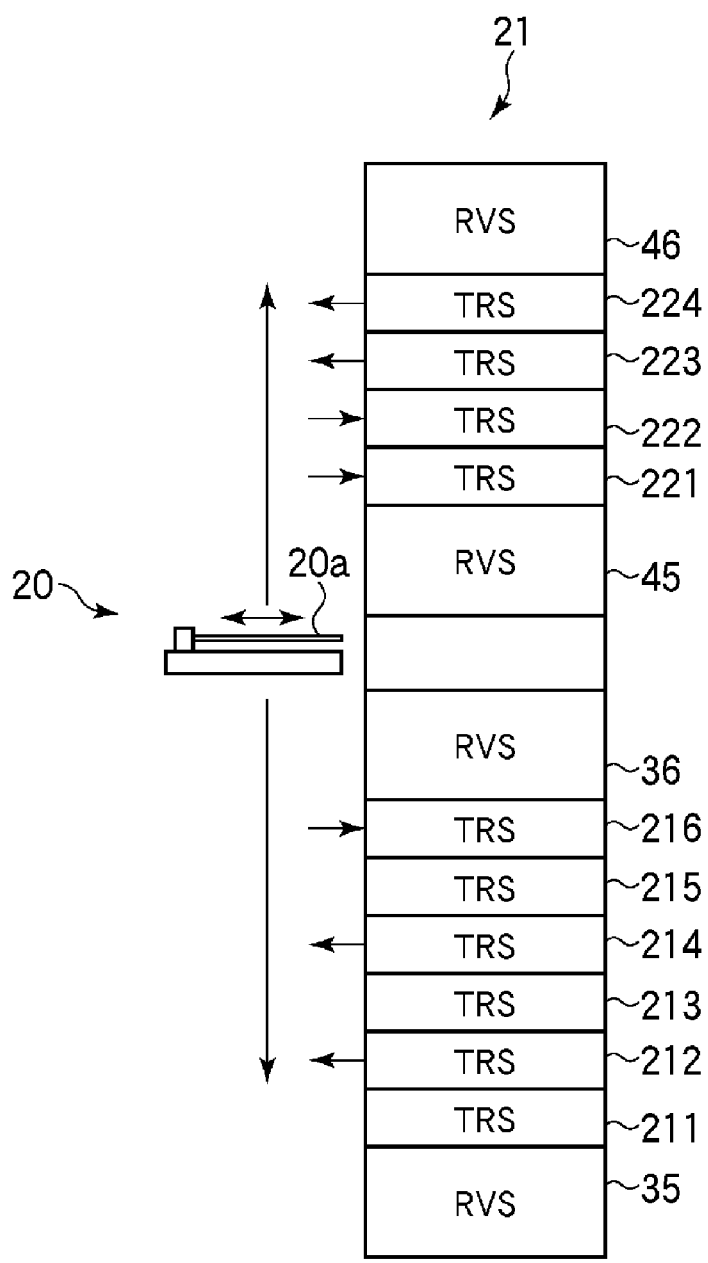
FIG. 5 shows a stacked tower and a delivery transfer mechanism of the processing block when viewed from the loading/unloading block.

FIG. 1 is a plane view of a schematic configuration of a substrate processing apparatus in accordance with the present embodiment, FIG. 2 is a longitudinal cross sectional side view thereof, FIG. 3 shows the inside of a processing block of the substrate processing apparatus of FIG. 1, FIG. 4 shows the processing block when viewed from the opposite side of a loading/unloading block, and FIG. 5 shows a stacked tower and a delivery transfer mechanism of the processing block when viewed from the loading/unloading block. As depicted in the drawings, a substrate processing apparatus 100 includes a loading/unloading block 1 configured to mount a FOUP (Front Opening Unified Pod) F serving as a storage container (cassette) in which wafers W of a predetermined number (for example, 25) as target substrates are airtightly accommodated in order to load and unload the wafers W; a processing block 2 configured to perform a scrub cleaning process onto the wafers W; and a controller 5 for controlling each component of the substrate processing apparatus 100.

The loading/unloading block 1 includes a mounting table 11 capable of mounting a plurality of the FOUPs F thereon; opening/closing members 12 provided at a front wall surface when viewed from the mounting table 11; and a loading/unloading transfer mechanism 10 configured to load and unload the wafer W with respect to the FOUP F and load and unload the wafer W with respect to a transit unit of a processing block 2 to be described later via the opening/closing member 12.

The processing block 2 includes a cleaning unit set 3 which performs a scrub cleaning process onto the wafer W and a delivery/reversal unit set 4 which delivers the wafer W before and after a cleaning process and reverses the wafer W.

The cleaning unit set 3 may be composed of a two-stage processing unit set, i.e., a lower part 3a and an upper part 3b. The lower part 3a includes four scrub cleaning units (SCR) 31 to 34 which perform a scrub cleaning process onto the wafer W and a main wafer transfer mechanism 30 which transfers the wafer W. In the lower part 3a, the scrub cleaning units (SCR) 31 and 32 are stacked in sequence from the bottom on one side (front side) and the scrub cleaning units (SCR) 33 and 34 are stacked in sequence from the bottom on the other side (rear side) with the main wafer transfer mechanism 30 disposed therebetween. Meanwhile, the upper part 3b includes four scrub cleaning units (SCR) 41 to 44 which perform a scrub cleaning process onto the wafer W and a main wafer transfer mechanism 40 which transfers the wafer W. In the upper part 3b, the scrub cleaning units (SCR) 41 and 42 are stacked in sequence from the bottom on one side (front side) and the scrub cleaning units (SCR) 43 and 44 are stacked in sequence from the bottom on the other side (rear side) with the main wafer transfer mechanism 40 disposed therebetween.

The delivery/reversal unit set 4 includes a stacked tower 21 in which a plurality of transit units (TRS) and reversal units (RVS) configured to reverse the wafer W are stacked; and a delivery transfer mechanism 20 which transfers the wafer W between certain transit units of the stacked tower 21.

The stacked tower 21 includes a lower part 21a corresponding to the lower part 3a of the cleaning unit set 3 and an upper part 21b corresponding to the upper part 3b thereof. In the lower part 21a, a reversal unit (RVS) 35, six transit units (TRS) 211, 212, 213, 214, 215, and 216, and a reversal unit (RVS) 36 are stacked in sequence from the bottom. Meanwhile, in the upper part 21b, a reversal unit (RVS) 45, four transit units (TRS) 221, 222, 223, and 224, and a reversal unit (RVS) 46 are stacked in sequence from the bottom.

Three transit units (TRS) 211, 213, and 215 of the six transit units (TRS) 211 to 216 of the lower part 21a may be used for a process in the lower part 3a of the cleaning unit set 3. The transit units (TRS) 212 and 214 may be used to transit the wafer W into, for example, the transit units (TRS) 221 and 222 of the upper part 21b. The transit unit (TRS) 216 may be used to receive the wafer W from the transit units (TRS) 223 and 224. Meanwhile, the transit units (TRS) 221, 222, 223, and 224 may be used for a process in the upper part 3b of the cleaning unit set 3. By way of example, the transit units (TRS) 211, 212, 213, 214, 221, and 222 may be used to load the wafer W and the transit units (TRS) 215, 216, 223, and 224 may be used to unload the wafer W.

The loading/unloading transfer mechanism 10 includes two transfer arms 10a and 10b, and these transfer arms 10a and 10b are configured to be capable of moving back and forth, moving up and down, rotating around a perpendicular axis, and moving in an arrangement direction of the FOUPs F. The wafer W can be delivered between the FOUP F and the transit units (TRS) 211 to 216 of the lower part 21a by the loading/unloading transfer mechanism 10. In this case, two wafers W can be transferred simultaneously by the two transfer arms 10a and 10b.

The main transfer mechanism 30 includes a transfer arm 30a, and the transfer arm 30a is configured to be capable of moving back and forth, moving up and down, and rotating around a perpendicular axis. The main transfer mechanism 30 can access the transit units (TRS) 211, 212, 213, 214, 215, and 216, the scrub cleaning units (SCR) 31 to 34, and the reversal units (RVS) 35 and 36 by the transfer arm 30a and the wafer W can be delivered between them.

The main transfer mechanism 40 includes a transfer arm 40a, and the transfer arm 40a is configured to be capable of moving back and forth, moving up and down, and rotating around a perpendicular axis. The main transfer mechanism 40 can access the transit units (TRS) 221, 222, 223, and 224, the scrub cleaning units (SCR) 41 to 44, and the reversal units (RVS) 45 and 46 by the transfer arm 40a and the wafer W can be delivered between them.

The delivery transfer mechanism 20 includes a transfer arm 20a, and the transfer arm 20a is configured to be capable of moving back and forth and moving up and down. The delivery transfer mechanism 20 is configured to deliver the wafer W between the transit units (TRS) 211, 212, 213, 214, 215 and 216 of the lower part 21a and the transit units (TRS) 221, 222, 223, and 224 of the upper part 21b by the transfer arm 20a. FIG. 5 illustrates an example case where the delivery transfer mechanism 20 is used to deliver the wafer W between the transit units (TRS) 213 and 214 of the lower part 21a and the transit units (TRS) 221, 222, 223, and 224 of the upper part 21b.

The scrub cleaning units (SCR) 31 to 34 and 41 to 44 may horizontally hold the wafer W within a cup and supply a cleaning fluid to perform a brush cleaning process onto a top surface of the wafer W while the wafer W is rotated.

The reversal units (RVS) 35, 36, 45, and 46 may include a reversal mechanism which holds the wafer W and reverses the front and rear surface of the wafer W by rotating the wafer W by about 180°. The wafer W is reversed by the reversal mechanism, and, thus, a scrub cleaning process can be performed onto any surface of the front surface and the rear surface of the wafer W in the scrub cleaning units (SCR) 31 to 34 and 41 to 44.

Figure 6:
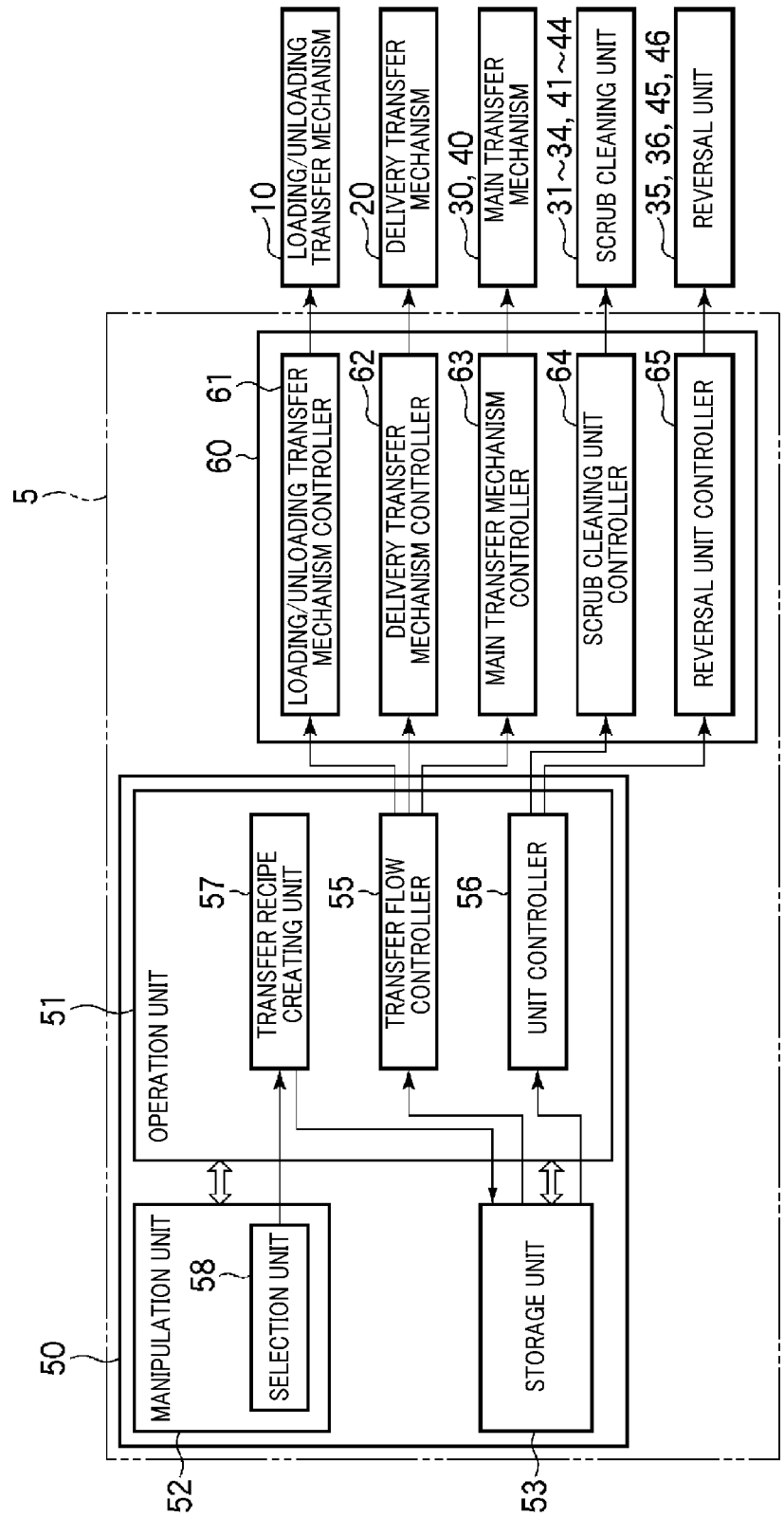
FIG. 6 is a block diagram showing a configuration of a controller of the substrate processing apparatus of FIG. 1.

The controller 5 may control a transfer of a wafer in the cleaning apparatus 100 and a process in each unit as depicted in FIG. 6, and the controller 5 may include a main controller 50 as a superordinate controller and a sub controller 60 as a subordinate controller which controls each transfer mechanism and each unit. The main controller 50 may include an operation unit 51 having a microprocessor (MPU), a manipulation unit 52, and a storage unit 53 which stores information required for a process.

The manipulation unit 52 and the storage unit 53 are connected to the operation unit 51. The manipulation unit 52 is composed of, for example, a touch-panel type display and configured to receive input required for a process. The storage unit 53 has a function of temporarily reading and writing information and a function of storing a control program required to perform various processes in the substrate processing apparatus 100 or a recipe used to operate each component of the substrate processing apparatus 100. The control program or recipe may be stored in a storage medium of the storage unit 53.

The controller 5 may control the whole substrate processing apparatus 100 as described above, but the present embodiment is characterized in that the controller 5 controls the transit units (TRS) to be automatically selected and the transfer recipe to be automatically created. Hereinafter, there will be given a detailed explanation focusing on such characteristics.

The operation unit 51 of the main controller 50 may include a transfer flow controller 55 which wholly controls a transfer flow of a wafer; a unit controller 56 which wholly controls a process in each unit; and a transfer recipe creating unit 57 which automatically selects a transit unit (TRS) to be used, automatically generates a transfer route of the wafer W, and creates a transfer recipe.

Further, the manipulation unit 52 may include a selection unit 58 which receives input for selecting a FOUP F to be used for loading a wafer, a scrub cleaning unit (SCR) and a reversal unit (RVS) to be used for a process, and a FOUP F to be used for unloading a wafer. The manipulation unit 52 may show a plurality of manipulation screens, and as described below, a module selection screen displayed by a manipulation on a transfer recipe edit screen may function as the selection unit 58.

The sub controller 60 may include a loading/unloading transfer mechanism controller 61 which controls the loading/unloading transfer mechanism 10; a delivery transfer mechanism controller 62 which controls the delivery transfer mechanism 20; a main transfer mechanism controller 63 which controls the main transfer mechanisms 30 and 40; a scrub cleaning unit controller 64 which individually controls the scrub cleaning units 31 to 34 and 41 to 44; and a reversal unit controller 65 which individually controls the reversal units 35, 36, 45, and 46. Further, the transfer flow controller 55 may be configured to control the loading/unloading transfer mechanism controller 61, the delivery transfer mechanism controller 62, and the main transfer mechanism controller 63, and the unit controller 56 may be configured to control the scrub cleaning unit controller 64 and the reversal unit controller 55.

In the main controller 50, if the FOUP F to be used for loading a wafer, the scrub cleaning unit (SCR) and the reversal unit (RVS) to be used for a process, and the FOUP F to be used for unloading a wafer are selected through the selection unit 58 of the manipulation unit 52, the transfer recipe creating unit 57 automatically selects a transit unit (TRS) to be used based on the selection and automatically calculates a transfer route for a transfer mechanism, and, the transfer recipe creating unit 57 creates a transfer recipe. The transfer recipe created by the transfer recipe creating unit 57 is stored in the storage unit 53. Further, the transfer flow controller 55 retrieves the transfer recipe created by the transfer recipe creating unit 57 from the storage unit 53 and sends a control instruction to the loading/unloading transfer mechanism controller 61, the delivery transfer mechanism controller 62, and the main transfer mechanism controller 63 so as to control transfer operations of the loading/unloading transfer mechanism 10, the delivery transfer mechanism 20, and the main transfer mechanisms 30 and 40 based on the transfer recipe.

Hereinafter, creation of a transfer recipe by the transfer recipe creating unit 57 will be explained in detail with reference to FIGS. 7 to 12.

In the following descriptions, each of a FOUP F, a transit unit (TRS), a scrub cleaning unit (SCR), and a reversal unit (RVS) is referred to as a module. Further, module numbers of four FOUPs F are assigned as 1-1 to 1-4 but expressed as 1-* on a screen. Furthermore, on the screen, a transit unit is expressed as "TRS", a scrub cleaning unit as "SCR", a reversal unit as "RVS", the loading/unloading transfer mechanism 10 as "CRA", the main transfer mechanisms 30 and 40 as "PRA", and the delivery transfer mechanism 20 as "MPRA." Moreover, module numbers of the loading/unloading transfer mechanism 10, the main transfer mechanisms 30 and 40, and the delivery transfer mechanism 20 are expressed as 1-0, 3-0, 4-0, and 2-0, respectively, module numbers of the transit units (TRS) 211 to 216 and 221 to 224 as 2-11 to 2-16 and 2-21 to 2-24, respectively, module numbers of the scrub cleaning units (SCR) 31 to 34 and 41 to 44 as 3-1 to 3-4 and 4-1 to 4-4, respectively, and module numbers of the reversal units (RVS) 35, 36, 45, and 46 as 3-5, 3-6, 4-5, and 4-6, respectively. Further, a FOUP (cassette) F for loading is expressed as "Start-CS" or "start stage" or "FUST" and a FOUP (cassette) F for unloading is expressed as "End-CS" or "end stage" or "FUST."

Figure 7:
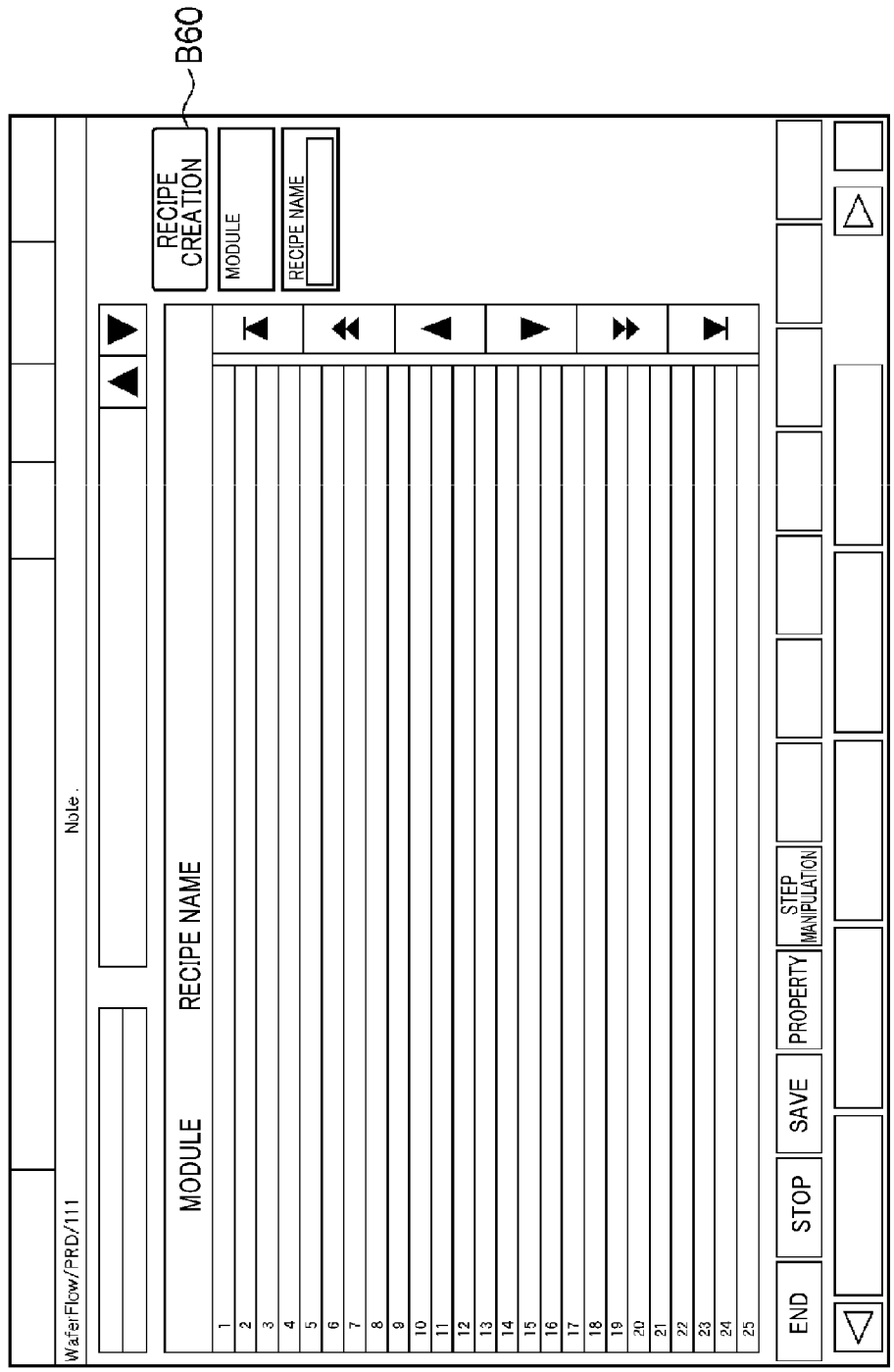
FIG. 7 shows a main screen of a transfer recipe edit screen in a manipulation unit.
Figure 8:
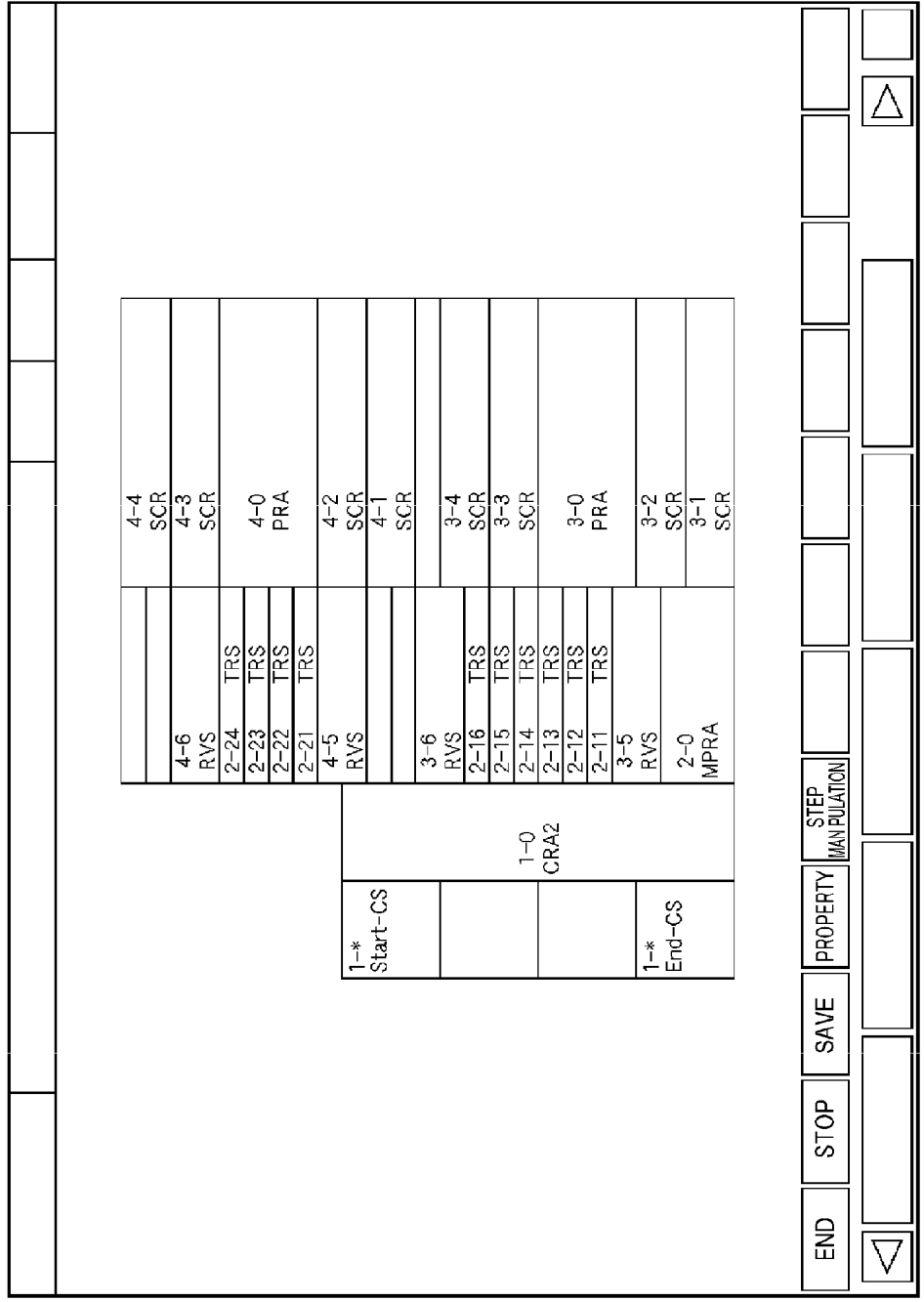
FIG. 8 shows a module selection screen displayed on the transfer recipe edit screen of FIG. 7.

A main screen of the transfer recipe edit screen by the manipulation unit 52 is illustrated in FIG. 7. If a recipe creating button B60 is touched on this screen, a module selection screen is displayed as shown in FIG. 8 and this module selection screen functions as the selection unit 58. On this module selection screen, the numbers of Start-CS and End-CS to be used are inputted and module numbers of process modules SCR and RVS to be used are selected by touch. Since transit units (TRS) and transfer mechanisms (CRA, MPRA, and PRA) are automatically selected, they cannot be selected by the operator.

In the transfer recipe creating unit 57, TRSs to be used may be automatically selected and transfer routes for the transfer mechanisms 10, 20, 30, and 40 may be also automatically calculated based on FOUPs F and process modules selected through the selection unit 58, and based on apparatus configuration setup information previously stored as parameters, without selection from the outside. At this time, by simulating a processing time, automatic selection of a TRS and automatic calculation of a transfer route can be performed so as to obtain an optimum throughput.

The parameters may include ranks of usage priority assigned to the respective transit units, and, thus, transit units of higher priority ranks may be automatically selected in sequence. If a transit unit of a next priority rank is being used, a transit unit of the highest priority rank among the remaining available transit units may be automatically selected.

In the present embodiment, transit units (TRS) for loading unprocessed wafers W and transit units (TRS) for unloading processed wafers W are determined, and as an assigned number is smaller, a rank of usage priority may be higher.

By way of example, if transit units (TRS) 211, 212, 213 and 214 are set to load the unprocessed wafers W while the transit units (TRS) 215 and 216 are set to unload the processed wafers w, automatic selection of the transit units and creation of a transfer recipe are carried out as follows. In the following description, CRA indicates the loading/unloading transfer mechanism 10, and a TRS represents a transit unit. Here, the terms "lower part 3*a*" and "upper part 3*b*" indicate transfer operations performed therein by the main transfer mechanisms 30 and 40 and processes performed therein by processing units such as scrub cleaning units.

1$^{st}$ wafer: TRS (211)→lower part 3*a*→TRS (215)→CRA→storage container
2$^{nd}$ wafer: TRS (212)→TRS (221)→upper part 3*b*→TRS (223)→TRS (216)→CRA→storage container
3$^{rd}$ wafer: TRS (213)→lower part 3*a*→TRS (215)→CRA→storage container
4$^{th}$ wafer: TRS (214)→TRS (222)→upper part 3*b*→TRS (224)→TRS (216)→CRA→storage container
5$^{th}$ wafer: TRS (211)→lower part 3*a*→TRS (215)→CRA→storage container
6$^{th}$ wafer: TRS (212)→TRS (221)→upper part 3*b*→TRS (223)→TRS (216)→CRA→storage container
7$^{th}$ wafer: TRS (213)→lower part 3*a*→TRS (215)→CRA→storage container
8$^{th}$ wafer: TRS (214)→TRS (222)→upper part 3*b*→TRS (224)→TRS (216)→CRA storage container Two sheets of wafers W may be concurrently transferred by the loading/unloading transfer mechanism 10. In such a case, the wafers W are first transferred into the transit units (TRS) 211 and 212 at the same time. Here, one of the wafers W is transferred into the lower part 3*a* of the cleaning unit set 3 from the transit unit (TRS) 211, while the other one of the wafers W is transferred into the upper part 3*b* from the transit unit (TRS) 212 via the transit unit (TRS) 221. After the wafers W are processed, the one wafer W is transferred into the transit unit (TRS) 215 from the lower part 3*a* of the cleaning unit set 3, and the other wafer W is transferred into the transit unit (TRS) 216 from the upper part 3*b* via the transit unit (TRS) 223. Then, the two wafers W are unloaded from the transit units (TRS) 215 and 216 at the same time by the loading/unloading transfer mechanism 10.

Subsequently, wafers W are loaded into the transit units (TRS) 213 and 214 at the same time. One of the wafers W is transferred into the lower part 3*a* of the cleaning unit set 3 from the transit unit (TRS) 213, while the other one of the wafers W is transferred into the upper part 3*b* from the transit unit (TRS) 214 via the transit unit (TRS) 222. After processed, the one wafer W is transferred into the transit unit (TRS) 215 from the lower part 3*a* of the cleaning unit set 3, and the other wafer W is transferred into the transit unit (TRS) 216 from the upper part 3*b* via the transit unit (TRS) 224. Then, the two wafers W are unloaded from the transit units (TRS) 215 and 216 at the same time by the loading/unloading transfer mechanism 10.

There will be explained an example of a transfer recipe actually created by the transfer recipe creating unit with reference to FIG. 9. Herein, there will be explained an example where two wafers are transferred simultaneously by the two transfer arms 10*a* and 10*b* of the loading/unloading transfer mechanism 10 to improve throughput. Here, in a transfer recipe, each module is assigned number and each number has a step number as a serial number.

In FIG. 9, number 1 denotes a start stage (FOUP number) selected on the module selection screen of FIG. 8, number 2 denotes transit units (TRS) for loading, numbers 3 to 6 denote process modules (reversal units (RVS) and scrub cleaning units (SCR)) selected on the module selection screen of FIG. 8, number 7 denotes transit units (TRS) for unloading, and number 8 denotes an end stage (FOUP number) selected on the module selection screen of FIG. 8. The loading stage and the unloading stage (numbers 1 and 8) and the process modules (numbers 3 to 6) are selected by the operator as described above. Meanwhile, selection of the transit units (TRS) for loading (number 2) and the transit units (TRS) for unloading (number 7) and calculation of the whole transfer route for the transfer mechanisms are automatically performed based on the selected loading stage, unloading stage and process modules.

Selection of the process modules is not limited to this example, and it may be possible to consider various cases such as a case where only a process module(s) of the lower part 3*a* of the cleaning unit set 3 is selected, a case where only a process module(s) of the lower part 3*a* and the upper part 3*b* is selected, a case where a reversal unit (RVS) is not selected in order to perform only a front surface cleaning process, or a case where a part of scrub cleaning units (SCR) is selected. In the present embodiment, a transfer route for the transit units (TRS) and the transfer mechanisms can be automatically generated depending on each of the various cases.

When the transit units (TRS) are selected by the transfer recipe creating unit 57, the transit units (TRS) may be classified into the transit units for loading (the loading/unloading block 1→the processing block 2) and the transit units for unloading (the processing block 2→the loading/unloading block 1) by using an access permit flag of a transfer arm access table of FIG. 10 stored in the storage unit 53 as a key. That is, a blank in the access permit flag of the transfer arm access table means that an access permit has not been set, and the transit units (TRS) on which an access permit has not been set are used as the transit units for loading and the transit units (TRS) on which an access permit has been set are used as the transit units for unloading. Accordingly, in FIG. 9, if all of the transit units (TRS) are available, module numbers of the transit units (TRS) for loading are 2-11 to 2-14, 2-21, and 2-22, and module numbers of the transit units (TRS) for unloading are 2-15, 2-16, 2-23, and 2-24.

The transfer arm access table of FIG. 10 may function as one of apparatus setup parameters. From selection of a process module through the selection unit 58, a transfer mechanism (a transfer arm) to be used may be selected, and, thus, transit units (TRS) which the selected transfer arm can access can be selected, and a transfer route through which an optimum throughput can be achieved can be generated.

Recipe data (number 2) on a loading transit unit (TRS) may be created when a process module is selected. In the example shown in FIG. 9, recipe data are created when a reversal unit (TRS) (number 3) is selected. Here, transit units (TRS) having the same number and multiple step numbers (number 2, step numbers 2 to 7) may be sorted by module number (in an ascending order). In this case, some transit units (TRS) may be accessed by a different transfer arm, to be specific, the MPRA but they can be registered with the same number. Furthermore, if a process module of the upper part 3b is not selected, the transit units (TRS) of numbers 2-21 and 2-22 which the MPRA accesses may be not selected.

If process modules of the lower part 3a and the upper part 3b are selected, in order to improve throughput, it is possible to control the loading transit units (TRS) of numbers 2-11 and 2-13 of the lower part 3a and the loading transit units (TRS) of numbers 2-21 and 2-22 of the upper part 3b to be alternately used so as to transfer the wafers W.

A wafer cleaning process may be performed continuously for a plurality of FOUPs F. Here, if the first wafer of the next FOUP is loaded into the lower part 3a while a cleansing process is performed onto the last wafer of one FOUP in the lower part 3a, it takes time to process, and, thus, throughput may be decreased. For this reason, it is desirable to create a transfer recipe so as to load the last wafer of one FOUP and the first wafer of the next FOUP into different processing units.

A transfer recipe of unloading transit units (TRS) may be created when the end stage is selected. In the example shown in FIG. 9, a transfer recipe of number 7 is created when an end stage of number 8 is selected. Transit units (TRS) having the same number and multiple step numbers may be sorted by module number (in an ascending order). Further, if a process module of the upper part 3b is not selected, the transit units (TRS) of numbers 2-23 and 2-24 which the MPRA accesses may be not selected.

Recipe date on process modules (numbers 3 to 6) are selected by the operator at each step.

Contents of the transfer recipe of FIG. 9 created in this manner will be explained in detail.

Referring to number 1 of recipe data, an operation of unloading two sheets of the wafers W from selected FOUPs 1-1 to 1-4 is repeatedly carried out by the two transfer arms 10a and 10b of the loading/unloading transfer mechanism 10 (CRA1-0).

Referring to number 2, an operation of mounting the wafers W on the transfer arms 10a and 10b onto the transit units (TRS) 2-11 and 2-12, an operation of transferring the wafer W mounted on the transit units (TRS) 2-12 to the transit unit (TRS) 2-21 by the delivery transfer mechanism (MPRA2-0), an operation of mounting the wafers W on the transfer arms 10a and 10b onto the transit units (TRS) 2-13 and 2-14, and an operation of transferring the wafer W mounted on the transit units (TRS) 2-14 to the transit unit (TRS) 2-22 by the delivery transfer mechanism 20 (MPRA2-0) are repeatedly carried out. That is, the transit units (TRS) 2-12 and 2-14 are used as transit units for relay, and the wafers W are alternately transferred to the transit units (TRS) 2-11 and 2-13 corresponding to the lower part 3a and the transit units (TRS) 2-21 and 2-22 corresponding to the upper part 3b.

Referring to number 3, the wafers W loaded into the transit units (TRS) 2-11 and 2-13 are transferred in sequence to the reversal unit (RVS) 3-5 by the transfer arm 30a of the main transfer mechanism 30 (PRA3-0) in the lower part 3a, and the wafers W loaded into the transit units (TRS) 2-21 and 2-22 are transferred in sequence to the reversal unit (RVS) 4-5 by the transfer arm 40a of the main transfer mechanism 40 (PRA4-0) in the upper part 3b.

Referring to number 4, the wafers W reversed in the reversal unit (RVS) 3-5 are transferred in sequence to the scrub cleaning units (SCR) of 3-1 and 3-2 by the transfer arm 30a (PRA3-0), and the wafers W reversed in the reversal unit (RVS) 4-5 are transferred in sequence to the scrub cleaning units (SCR) 4-1 and 4-2 by the transfer arm 40a (PRA4-0).

Referring to number 5, the wafers W in the scrub cleaning units (SCR) 3-1 and 3-2 are transferred in sequence to the reversal unit (RVS) of 3-6 by the transfer arm 30a (PRA3-0), and the wafers W in the scrub cleaning units (SCR) 4-1 and 4-2 are transferred in sequence to the reversal unit (RVS) 4-6 by the transfer arm 40a (PRA4-0).

Referring to number 6, the wafers W reversed in reversal unit (RVS) 3-6 are transferred in sequence to the scrub cleaning units (SCR) 3-3 and 3-4 by the transfer arm 30a (PRA3-0), and the wafers W reversed in reversal unit (RVS) 4-6 are transferred in sequence to the scrub cleaning units (SCR) 4-3 and 4-4 by the transfer arm 40a (PRA4-0).

Referring to number 7, an operation of transferring the wafers W in the scrub cleaning units (SCR) 3-3 and 3-4 in sequence to the transit unit (TRS) 2-15 by the transfer arm 30a (PRA3-0), an operation of transferring the wafers W in sequence to the transit units (TRS) 2-23 and 2-24 by the transfer arm 40a (PRA4-0), and an operation of transferring the wafers W in the transit units (TRS) 2-23 and 2-24 in sequence to the transit unit (TRS) 2-16 by the transfer arm 20a (MPRA2-0) are repeatedly carried out.

Referring to number 8, an operation of receiving two sheets of the wafers W from the transit units (TRS) 2-15 and 2-16 by the selected FOUPs 1-1 to 1-4 through the transfer arms 10 and 10b (CRA1-0) is repeatedly carried out.

In this example transfer recipe, a cleaning process is first performed onto the rear surface of the wafer W in the scrub cleaning units (SCR) 3-1, 3-2, 4-1, and 4-2, and then a cleaning process is performed onto the front surface of the wafer W in the scrub cleaning units (SCR) 3-3, 3-4, 4-3, and 4-4.

Figure 11:
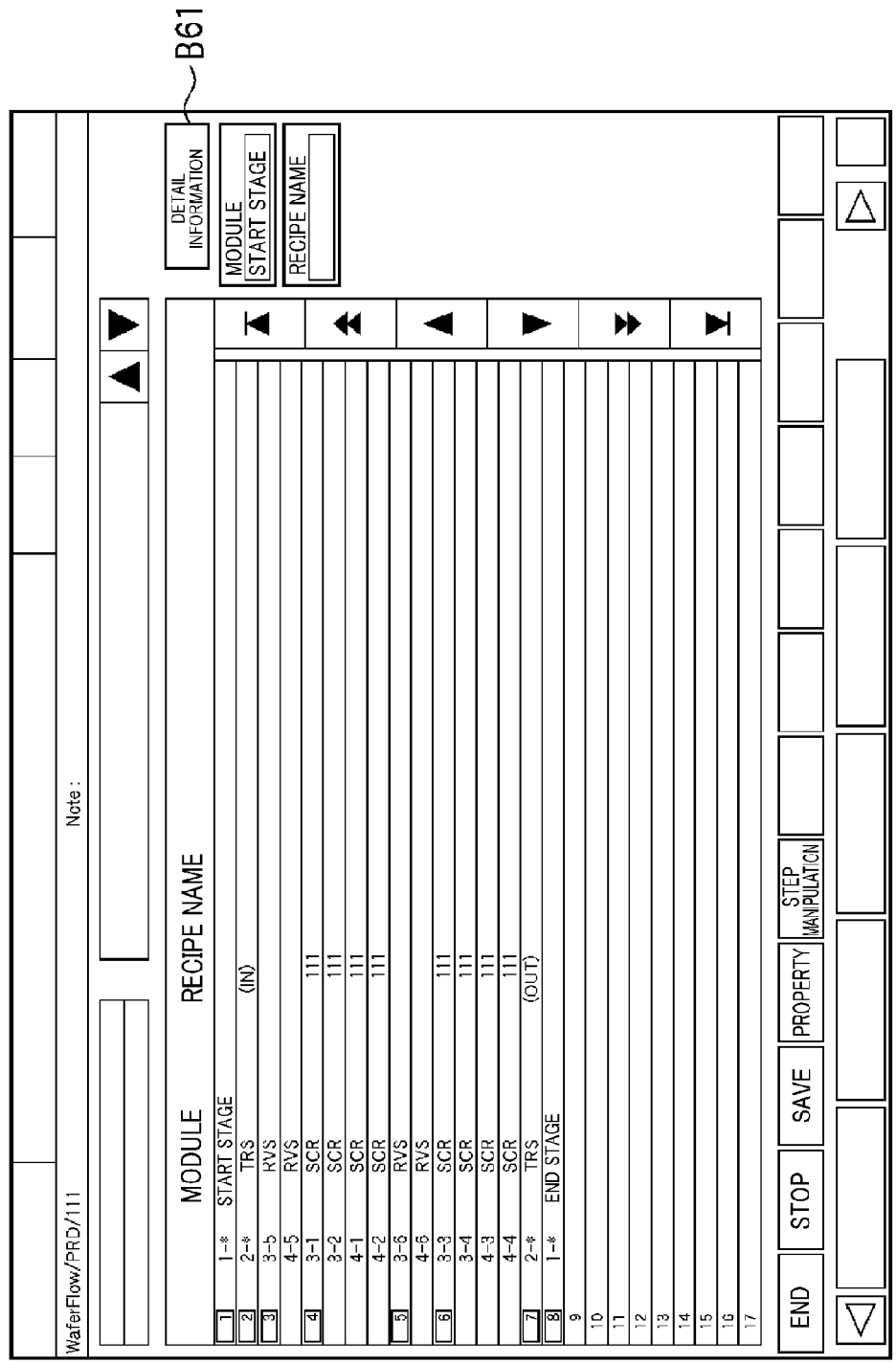
FIG. 11 shows a display screen displaying a transfer recipe created by the transfer recipe creating unit.

The transfer recipe created in this manner is displayed as an edit screen as shown in FIG. 11, a loading stage, an unloading stage, RVS, and SCR can be edited if necessary. If there is any change to them, selection of a transit unit (TRS) and creation of recipe data are carried out again. As depicted in FIG. 11, since transit units (TRS) are automatically selected and do not need to be edited, transit units are grouped into one group for loading and another group for unloading and briefly displayed, and, thus, module numbers thereof are expressed as 2-*. In order to check detail information, if a detail information button B61 is touched on the screen of FIG. 11, detail information of the transit units (TRS) is displayed as shown in FIG. 12.

The transfer recipe created in this manner can be registered and stored through the transfer recipe edit screen, the registered transfer recipe can be retrieved to be used, and the retrieved transfer recipe can be edited on the transfer recipe edit screen.

Further, when a transfer flow is controlled based on a transfer recipe created by the transfer recipe creating unit 57, a control instruction is sent from the transfer flow controller 55 to the loading/unloading transfer mechanism controller 61, the delivery transfer mechanism controller 62, and the main transfer mechanism controller 63 so as to control the transfer mechanisms 10, 20, 30, and 40.

Hereinafter, there will be briefly explained an operation at the time of performing a cleaning process onto a wafer W based on the transfer recipe described in the above example with reference to FIGS. 1 to 5.

Firstly, two sheets of wafers W are unloaded by the two transfer arms 10a and 10b of the loading/unloading transfer mechanism 10 from a FOUP (F) selected to unload wafers and the two wafers W are delivered to the transit units (TRS) 211 and 212 corresponding to the lower part 3a. The wafer W delivered to the transit unit (TRS) 211 is processed in the lower part 3a. Meanwhile, the wafer W delivered to the transit unit (TRS) 212 is transferred to the transit unit (TRS) 221 corresponding to the upper part 3b by the transfer arm of the delivery transfer mechanism 20 and the wafer W delivered to the transit unit (TRS) 221 is processed in the upper part 3b.

When the transfer arms 10a and 10b of the loading/unloading transfer mechanism 10 are empty, the next two wafers W are unloaded from the same FOUP F by the two transfer arms 10a and 10b and delivered to the transit units (TRS) 213 and 214. The wafer W delivered to the transit unit (TRS) 213 is processed in the lower part 3a. Meanwhile, the wafer W delivered to the transit unit (TRS) 214 is transferred to the transit unit (TRS) 222 corresponding to the upper part 3b by the transfer arm of the delivery transfer mechanism 20 and the wafer W delivered to the transit unit (TRS) 222 is processed in the upper part 3b.

The wafers W transferred to the transit units (TRS) 211 and 213 are transferred in sequence to the reversal unit (RVS) 35 by the transfer arm 30a of the main transfer mechanism 30 and, the wafers W are reversed upside down so that their rear surfaces become top surfaces. Subsequently, the reversed wafers W are transferred in sequence to the scrub cleaning units (SCR) 31 and 32 by the transfer arm 30a of the main transfer mechanism 30 and, the cleaning fluid is supplied to the top surfaces (rear surfaces) of the wafers W to perform a scrub cleaning with a brush while the wafers W are rotated. The wafers W of which the rear surfaces have been cleaned are transferred in sequence to the reversal unit (RVS) 36 by the transfer arm 30a of the main transfer mechanism 30 and the wafers W are reversed upside down so that their front surfaces become top surfaces. Thereafter, the reversed wafers W are transferred in sequence to the scrub cleaning units (SCR) 33 and 34 by the transfer arm 30a of the main transfer mechanism 30 and the cleaning fluid is supplied to the top surfaces (front surfaces) of the wafers W to perform a scrub cleaning with a brush while the wafers W are rotated. The wafers W of which the front surfaces have been cleaned are transferred in sequence to the transit unit (TRS) 215 by the transfer arm 30a of the main transfer mechanism 30.

Meanwhile, the wafers W transferred to the transit units (TRS) 221 and 222 are transferred in sequence to the reversal unit (RVS) 45 by the transfer arm 40a of the main transfer mechanism 40 in the upper part 3b and the wafers W are reversed upside down so that their rear surfaces become top surfaces. Subsequently, the reversed wafers W are transferred in sequence to the scrub cleaning units (SCR) 41 and 42 by the transfer arm 40a of the main transfer mechanism 40 and the cleaning fluid is supplied to the top surfaces (rear surfaces) of the wafers W to perform a scrub cleaning with a brush while the wafers W are rotated. The wafers W of which the rear surfaces have been cleaned are transferred in sequence to the reversal unit (RVS) 46 by the transfer arm 40a of the main transfer mechanism 40 and the wafers W are reversed upside down so that their front surfaces become top surfaces. Thereafter, the reversed wafers W are transferred in sequence to the scrub cleaning units (SCR) 43 and 44 by the transfer arm 40a of the main transfer mechanism 40 and the cleaning fluid is supplied to the top surfaces (front surfaces) of the wafers W to perform a scrub cleaning with a brush while the wafers W are rotated. The wafers W of which the front surfaces have been cleaned are transferred in sequence to the transit units (TRS) 223 and 224 by the transfer arm 40a of the main transfer mechanism 40. The wafers W on the transit units (TRS) 223 and 224 are transferred in sequence to the transit unit (TRS) 216.

The wafers W in the transit units (TRS) 215 and 216 are taken at a time by the two transfer arms 10a and 10b of the loading/unloading transfer mechanism 10 and received by a FOUP F selected to receive the wafers W.

By repeating these operations, a cleaning process in the lower part 3a and a cleaning process in the upper part 3b are performed alternately, and, thus, cleaning processes are performed onto all of the wafers W in a single FOUP F.

The above operations are carried out based on the transfer recipe illustrated in FIG. 9, and if the transfer recipe is changed, operations will be changed accordingly.

As described above, in accordance with the present embodiment, if FOUPs F for loading and unloading wafers W, and scrub cleaning units (SCR) and reversal units (RVS) as processing units (process modules) are selected, transit units (TRS) to be used are automatically selected, and a transfer route for a transfer mechanism is automatically generated, thereby creating a transfer recipe. Therefore, creation of a transfer recipe can be simplified and wafers W can be transferred along a transfer route through which an optimum throughput can be obtained.

Conventionally, in order to cope with various processing patterns, since FOUPs F for loading and unloading wafers W, and scrub cleaning units (SCR) and reversal units (RVS) as processing units (process modules) are selected and transit units (TRS) and a transfer route are also selected and set, creation of a transfer recipe is complicated. Further, since there may be a limitation in selecting transit units (TRS) depending on selection of process modules, it is required to verify whether or not selection is proper at the time of creation of the transfer recipe and if not proper, it is required to recreate the transfer recipe with effort. Furthermore, even if selection is proper, optimum throughput may not be obtained.

In this regard, in the present embodiment, transit units (TRS) are automatically selected and a transfer route is also automatically calculated as described above. Therefore, a transfer recipe can be created with less effort and its verification is not needed, and, thus, creation of a transfer recipe can be remarkably simplified. Further, by simulating a processing time based on the selected FOUPs F, the selected process modules, and the apparatus configuration setup information previously stored as parameters, it is possible to generate a transfer route through which the optimum throughput can be obtained.

The present disclosure is not limited to the above-described embodiments and can be modified in various ways. In the above embodiments, an example apparatus for cleaning a front surface and a rear surface of a wafer has been described, but the present disclosure is not limited thereto. By way of example, as long as an apparatus including a plurality of processing units and a plurality of transit units transfers a target substrate accommodated in a storage container of a loading/unloading unit into one of the plurality of processing units via one of the plurality of transit units and accommodates the processed target substrate in the storage container via one of the transit units, any process may be adopted. Further, a configuration of an apparatus is not limited to the above embodiments and it may be possible to employ various apparatuses capable of carrying out the present disclosure.

Further, in the above embodiments, there has been described a case where a semiconductor wafer is used as a target substrate but it is possible to employ other substrates such as a substrate for a flat panel display (FPD) represented by a glass substrate for a liquid crystal display (LCD).

What is claimed is:

1. A substrate processing apparatus comprising:
    a loading/unloading unit including a mounting table on which a plurality of storage containers accommodating target substrates are mounted;
    a processing unit set including a plurality of processing units, each performing a process on a target substrate;
    a plurality of transit units that transit the target substrate between the loading/unloading unit and the processing unit set;
    a selection unit that receives an input for selecting a storage container for loading from among the plurality of storage containers, an input for selecting a storage container for unloading from among the plurality of storage containers, and an input for selecting a processing unit to be used for processing the target substrate from among the plurality of processing units; and
    a transfer recipe creating unit that automatically selects a transit unit to be used from among the plurality of transit units based on the storage container for loading, the storage container for unloading, and the processing unit selected through the selection unit, automatically generates a transfer route of the target substrate, and creates a transfer recipe,
    wherein the processing unit set includes a main transfer mechanism that transfers the target substrate between the plurality of processing units and the plurality of transit units,
    the processing unit set further includes a lower processing unit set and an upper processing unit set, and
    the plurality of transit units are divided into transit units corresponding to the lower processing unit set and transit units corresponding to the upper processing unit set, and
    wherein the loading/unloading unit includes a loading/unloading transfer mechanism that transfers the target substrate between the storage container and the plurality of transit units,
    the main transfer mechanism includes a first main transfer mechanism corresponding to the lower processing unit set and a second main transfer mechanism corresponding to the upper processing unit set, and
    the transfer recipe creating unit automatically selects the transit unit to be used from among the plurality of transit units, automatically generates the transfer route of the target substrate for the loading/unloading transfer mechanism, the first main transfer mechanism and the second main transfer mechanism, and creates the transfer recipe.

2. The substrate processing apparatus of claim 1, wherein the transfer recipe creating unit automatically selects the transit unit and automatically generates the transfer route so as to obtain an optimum throughput by simulating a processing time.

3. The substrate processing apparatus of claim 1, wherein the transfer recipe creating unit classifies the plurality of transit units into transit units for loading the target substrate and transit units for unloading the target substrate.

4. The substrate processing apparatus of claim 1, wherein, when the selecting unit receives an input for selecting either one of the lower processing unit set and the upper processing unit set, the transfer recipe creating unit does not select a transit unit corresponding to an unselected processing unit set.

5. The substrate processing apparatus of claim 1, wherein the processing unit set further includes a delivery transfer mechanism that transfers the target substrate between transit units corresponding to the lower processing unit set and transit units corresponding to the upper processing unit set among the plurality of transit units, and
    the transfer recipe creating unit creates a recipe so as to allow the delivery transfer mechanism to transfer the target substrate between the transit units corresponding to the lower processing unit set and the transit units corresponding to the upper processing unit set among the plurality of transit units.

6. The substrate processing apparatus of claim 1, further comprising:
    a transfer flow controller that controls the loading/unloading transfer mechanism, the first main transfer mechanism and the second main transfer mechanism based on the transfer recipe created by the transfer recipe creating unit.

7. The substrate processing apparatus of claim 1, wherein the transfer recipe creating unit automatically selects the transit unit to be used among the plurality of transit units based on the storage container for loading or the storage container for unloading and the processing unit selected through the selection unit and based on apparatus configuration setup information previously stored as a parameter.

8. The substrate processing apparatus of claim 7, wherein the parameter includes a rank of usage priority assigned to each of the plurality of transit units, and transit units of higher ranks of priority are selected in sequence.

9. The substrate processing apparatus of claim 7, wherein the parameter includes a rank of usage priority assigned to each of the plurality of transit units, and transit units of higher ranks of priority are selected in sequence among available transit units.

10. The substrate processing apparatus of claim 1, further comprising:
a storage unit that stores a recipe used to operate the plurality of processing units and the transfer recipe created by the transfer recipe creating unit.

11. The substrate processing apparatus of claim 10, further comprising:
a unit controller that controls the plurality of processing units based on the recipe used to operate the plurality of processing units which is stored in the storage unit.

12. The substrate processing apparatus of claim 10, further comprising:
a transfer flow controller that controls the loading/unloading transfer mechanism, the first main transfer mechanism and the second main transfer mechanism based on the transfer recipe created by the transfer recipe creating unit; and
a unit controller that controls the plurality of processing units based on the recipe used to operate the plurality of processing units which is stored in the storage unit.

13. A substrate transfer method of a substrate processing apparatus that unloads a target substrate from a storage container accommodating the target substrate, transfers the target substrate into one of a plurality of processing units performing a process on the target substrate via one of a plurality of transit units transiting the target substrate, and performs a process on the target substrate, the method comprising:
selecting a storage container to be used from among a plurality of storage containers and selecting a processing unit to be used from among the plurality of processing units;
creating a transfer recipe by automatically selecting a transit unit to be used from among the plurality of transit units based on the selected storage container and the selected processing unit and automatically generating a transfer route of the target substrate; and
controlling a transfer of the target substrate based on the created transfer recipe,
wherein the plurality of processing units are included in a processing unit set, and the processing unit set includes a main transfer mechanism that transfers the target substrate between the plurality of processing units and the plurality of transit units,
the processing unit set further includes a lower processing unit set and an upper processing unit set,
the plurality of transit units are divided into transit units corresponding to the lower processing unit set and transit units corresponding to the upper processing unit set,
the substrate processing apparatus includes a loading/unloading transfer mechanism that transfers the target substrate between the storage container and the plurality of transit units, and
the main transfer mechanism includes a first main transfer mechanism corresponding to the lower processing unit set and a second main transfer mechanism corresponding to the upper processing unit set, and
wherein the step of creating the transfer recipe includes automatically selecting the transit unit to be used from among the plurality of transit units, and automatically generating the transfer route of the target substrate for the loading/unloading transfer mechanism, the first main transfer mechanism and the second main transfer mechanism.

14. The substrate transfer method of claim 13, wherein a rank of usage priority is assigned to each of the plurality of transit units and transit units of higher ranks of priority are selected in sequence to create the transfer recipe.

15. The substrate transfer method of claim 13, wherein a rank of usage priority is assigned to each of the plurality of transit units and transit units of higher ranks of priority are selected in sequence among available transit units to create the transfer recipe.

16. The substrate transfer method of claim 13, wherein the transfer recipe is created by automatically selecting the transit unit and automatically generating the transfer route so as to obtain an optimum throughput by simulating a processing time.

17. The substrate transfer method of claim 13, wherein the plurality of transit units are classified into transit units for loading the target substrate and transit units for unloading the target substrate to create the transfer recipe.

* * * * *

UNITED STATES PATENT AND TRADEMARK OFFICE
CERTIFICATE OF CORRECTION

PATENT NO. : 8,630,733 B2  Page 1 of 1
APPLICATION NO. : 12/892109
DATED : January 14, 2014
INVENTOR(S) : Kouichi Itou It is certified that error appears in the above-identified patent and that said Letters Patent is hereby corrected as shown below:

In the specification, column 10, line 12 please add - 20 - between "mechanism" and "(MPRA2-0)"

Signed and Sealed this
Thirteenth Day of May, 2014

Michelle K. Lee
*Deputy Director of the United States Patent and Trademark Office*